(12) United States Patent
Lovell et al.

(10) Patent No.: US 10,236,113 B2
(45) Date of Patent: *Mar. 19, 2019

(54) SYSTEM AND METHOD FOR REDUCING PARTIAL DISCHARGE IN HIGH VOLTAGE PLANAR TRANSFORMERS

(71) Applicant: General Electric Company, Schenectady, NY (US)

(72) Inventors: Alan Carroll Lovell, Roanoke, VA (US); Mark Eugene Shepard, Roanoke, VA (US); Andrew David McArthur, Salem, VA (US); Qin Chen, Schenectady, NY (US); Todd David Greenleaf, Salem, VA (US)

(73) Assignee: General Electric Company, Schenectady, NY (US)

( * ) Notice: Subject to any disclaimer, the term of this patent is extended or adjusted under 35 U.S.C. 154(b) by 83 days.

This patent is subject to a terminal disclaimer.

(21) Appl. No.: 15/483,679

(22) Filed: Apr. 10, 2017

(65) Prior Publication Data

US 2017/0213636 A1 Jul. 27, 2017

Related U.S. Application Data

(63) Continuation of application No. 14/184,632, filed on Feb. 19, 2014, now Pat. No. 9,620,278.

(51) Int. Cl.
*H01F 27/36* (2006.01)
*H01F 27/32* (2006.01)
(Continued)

(52) U.S. Cl.
CPC ......... *H01F 27/2804* (2013.01); *H01F 27/24* (2013.01); *H01F 41/0206* (2013.01);
(Continued)

(58) Field of Classification Search
CPC .................................. H01F 5/00; H01F 27/28
(Continued)

(56) References Cited

U.S. PATENT DOCUMENTS 3,517,361 A * 6/1970 Reifel ................... H01F 27/362
174/359
5,838,554 A 11/1998 Lanni
(Continued)

FOREIGN PATENT DOCUMENTS

EP 0715322 6/1996
EP 0933789 A2 8/1999
(Continued)

OTHER PUBLICATIONS

PCT/US2015/014537 International Search Report and Written Opinion, dated Jul. 22, 2015, 9 pgs.
(Continued)

*Primary Examiner* — Tsz Chan
(74) *Attorney, Agent, or Firm* — Fletcher Yoder, P.C.

(57) ABSTRACT

A device includes a printed circuit board (PCB). The device may also include a high voltage coil disposed on the PCB and a low voltage coil disposed on the PCB. Further, a conductive shield forms a three-dimensional enclosure around the high voltage coil and confines an electric field generated by the device to the PCB.

20 Claims, 5 Drawing Sheets

(51) Int. Cl.
*H01F 5/00* (2006.01)
*H01F 27/28* (2006.01)
*H05K 1/02* (2006.01)
*H05K 1/16* (2006.01)
*H05K 1/14* (2006.01)
*H05K 3/46* (2006.01)
*H01F 27/24* (2006.01)
*H01F 41/04* (2006.01)
*H01F 41/02* (2006.01)

(52) U.S. Cl.
CPC ......... *H01F 41/043* (2013.01); *H05K 1/0224* (2013.01); *H05K 1/0254* (2013.01); *H05K 1/144* (2013.01); *H05K 1/165* (2013.01); *H05K 3/46* (2013.01); *H01F 2027/2809* (2013.01); *H05K 2201/0715* (2013.01); *H05K 2201/09672* (2013.01)

(58) Field of Classification Search
USPC .................................................. 336/200, 232
See application file for complete search history.

(56) References Cited

U.S. PATENT DOCUMENTS

| | | | |
|---|---|---|---|
| 6,069,548 A | 5/2000 | Baarman et al. | |
| 6,144,276 A | 11/2000 | Booth | |
| 6,211,767 B1 | 4/2001 | Jitaru | |
| 6,278,354 B1 | 8/2001 | Booth | |
| 6,307,457 B1 | 10/2001 | Wissink et al. | |
| 6,320,490 B1 | 11/2001 | Clayton | |
| 6,420,952 B1 | 7/2002 | Redilla | |
| 6,600,404 B1 | 7/2003 | Kajino | |
| 6,606,022 B1 | 8/2003 | Taurand | |
| 6,608,545 B2 | 8/2003 | Fricker et al. | |
| 6,794,977 B2 | 9/2004 | Christensen | |
| 6,847,284 B2 | 1/2005 | Gamou et al. | |
| 6,882,260 B2 | 4/2005 | Katzir et al. | |
| 6,906,609 B1 | 6/2005 | Piechnick | |
| 6,927,661 B2 | 8/2005 | He et al. | |
| 6,972,657 B1 | 12/2005 | Pacala et al. | |
| 6,987,678 B2 | 1/2006 | Giandalia et al. | |
| 7,019,996 B2 | 3/2006 | Zhu et al. | |
| 7,042,325 B2 | 5/2006 | Giandalia et al. | |
| 7,091,817 B2 | 8/2006 | Peck et al. | |
| 7,233,224 B2 | 6/2007 | Strzalkowski et al. | |
| 7,289,329 B2 | 10/2007 | Chen et al. | |
| 7,292,126 B2 | 11/2007 | So | |
| 7,307,493 B2 | 12/2007 | Feldman | |
| 7,332,993 B1 | 2/2008 | Nussbaum | |
| 7,414,507 B2 | 8/2008 | Giandalia et al. | |
| 7,414,510 B1 | 8/2008 | Cheng | |
| 7,474,190 B2 | 1/2009 | Strzalkowski et al. | |
| 7,502,234 B2 | 3/2009 | Goliszek et al. | |
| 7,663,460 B2 | 2/2010 | Suzuki | |
| 7,671,714 B2 | 3/2010 | Tiemeijer | |
| 7,746,208 B2 | 6/2010 | Loef et al. | |
| 7,821,374 B2 | 10/2010 | Harrison et al. | |
| 7,859,382 B2 | 12/2010 | Koprivnak et al. | |
| 7,864,018 B2 | 1/2011 | Giandalia et al. | |
| 7,872,560 B2 | 1/2011 | Hsu | |
| 7,932,801 B2 | 4/2011 | Loef | |
| 8,013,708 B2 | 9/2011 | Tsai | |
| 2001/0042905 A1 | 11/2001 | Katzir et al. | |
| 2003/0067377 A1 | 4/2003 | Fricker et al. | |
| 2003/0071706 A1 | 4/2003 | Christensen | |
| 2003/0132825 A1 | 7/2003 | Gamou | |
| 2003/0179067 A1 | 9/2003 | Gamou et al. | |
| 2004/0027224 A1 | 2/2004 | Giandalia et al. | |
| 2004/0130913 A1 | 7/2004 | Giandalia et al. | |
| 2004/0174241 A1 | 9/2004 | He et al. | |
| 2004/0240126 A1 | 12/2004 | Tiemeijer | |
| 2004/0257190 A1 | 12/2004 | Peck et al. | |
| 2005/0083714 A1 | 4/2005 | Zhu et al. | |
| 2005/0242916 A1 | 11/2005 | So | |
| 2005/0270745 A1 | 12/2005 | Chen et al. | |
| 2006/0028313 A1 | 2/2006 | Strzalkowski et al. | |
| 2006/0055495 A1 | 3/2006 | Rategh | |
| 2006/0091974 A1 | 5/2006 | Feldman | |
| 2006/0109072 A1 | 5/2006 | Giandalia et al. | |
| 2007/0085121 A1 | 4/2007 | Mikura | |
| 2007/0120639 A1 | 5/2007 | Strzalkowski et al. | |
| 2008/0013350 A1 | 1/2008 | Goliszek et al. | |
| 2008/0079524 A1 | 4/2008 | Suzuki | |
| 2008/0094164 A1 | 4/2008 | Hsu | |
| 2008/0186120 A1 | 8/2008 | Loef | |
| 2008/0231403 A1 | 9/2008 | Hsu | |
| 2008/0258838 A1 | 10/2008 | Oshima | |
| 2008/0266043 A1 | 10/2008 | Giandalia et al. | |
| 2009/0002111 A1 | 1/2009 | Harrison et al. | |
| 2009/0002116 A1 | 1/2009 | Loef et al. | |
| 2009/0051477 A1 | 2/2009 | Kamgaing | |
| 2009/0071694 A1 | 3/2009 | Pawel | |
| 2009/0115564 A1* | 5/2009 | Minteer ............. H01F 27/2804 336/84 M |
| 2009/0295528 A1 | 12/2009 | Silva et al. | |
| 2010/0079229 A1 | 4/2010 | Koprivnak et al. | |
| 2010/0079233 A1 | 4/2010 | Koprivnak et al. | |
| 2010/0208439 A1 | 8/2010 | Oka | |
| 2010/0253461 A1 | 10/2010 | Schiene et al. | |
| 2011/0050379 A1 | 3/2011 | Kim | |
| 2011/0140824 A1 | 6/2011 | Herhold | |
| 2011/0148563 A1 | 6/2011 | Tsai | |
| 2011/0227688 A1 | 9/2011 | Park et al. | |
| 2012/0057388 A1 | 3/2012 | Garrity | |
| 2012/0098484 A1* | 4/2012 | Cheng ................... H01F 38/14 320/108 |
| 2012/0300417 A1 | 11/2012 | Kusukawa | |
| 2013/0175984 A1* | 7/2013 | Yamazaki ............ H04B 5/0037 320/108 |
| 2013/0200982 A1* | 8/2013 | Adachi ................. H01F 27/365 336/84 R |
| 2013/0207767 A1* | 8/2013 | Worthington ....... H01F 27/2804 336/84 C |
| 2015/0155090 A1 | 6/2015 | Burnett et al. | |

FOREIGN PATENT DOCUMENTS

| | | | |
|---|---|---|---|
| EP | 1085535 A1 | 3/2001 | |
| EP | 1085537 A2 | 3/2001 | |
| EP | 1293995 A2 | 3/2003 | |
| EP | 1420420 A2 | 5/2004 | |
| EP | 1536436 A1 | 6/2005 | |
| EP | 1811530 | 7/2007 | |
| EP | 1876695 | 1/2008 | |
| EP | 1973124 A1 | 9/2008 | |
| EP | 2530823 | 12/2012 | |
| EP | 2682958 | 1/2014 | |
| EP | 2682958 A1 * | 1/2014 | ......... H01F 27/2804 |
| WO | 9801872 | 1/1998 | |
| WO | 9806112 | 2/1998 | |
| WO | 9934379 | 7/1999 | |
| WO | 0011687 | 3/2000 | |
| WO | 0178090 A1 | 10/2001 | |
| WO | 03015110 A1 | 2/2003 | |
| WO | 03030189 A1 | 4/2003 | |
| WO | 2005122377 A1 | 12/2005 | |
| WO | 2006117739 A1 | 11/2006 | |
| WO | 2007072282 A2 | 6/2007 | |
| WO | 2008088682 A2 | 7/2008 | |
| WO | 2008132645 A1 | 11/2008 | |
| WO | 2011029475 A1 | 3/2011 | |

OTHER PUBLICATIONS

Pawel et al., "Speed and Precision in Gate Drives," Power Systems Design, pp. 34-37, Dec. 2008.

* cited by examiner

SYSTEM AND METHOD FOR REDUCING
PARTIAL DISCHARGE IN HIGH VOLTAGE
PLANAR TRANSFORMERS

CROSS-REFERENCE TO RELATED
APPLICATION

This application is a continuation of U.S. patent application Ser. No. 14/184,632, which was filed on Feb. 19, 2014, now U.S. Pat. No. 9,620,278, which issued on Apr. 11, 2017.

BACKGROUND

The subject matter disclosed herein relates to medium to high voltage power systems, such as switched mode power supplies. Specifically, the subject matter relates to planar transformers utilized in switched mode power supplies. In recent years, planar transformers have gained acceptance in various switched mode power supply technologies, as they offer numerous technical and commercial advantages over more traditional power transformers.

Generally, planar transformers are manufactured using printed circuit boards (PCBs). A magnetic core is attached to a multilayer PCB. High and low voltage coils are created by depositing thin, wide copper traces in spiral patterns around the magnetic core on the various layers of the PCB. During operation, one of the coils is selected as the primary winding, and the other coil is designated as the secondary winding. A varying current is applied to the primary winding, which induces a varying magnetic field in the magnetic core. This in turn leads to a varying voltage induced within the secondary winding.

Because planar transformers are manufactured using PCBs, manufacturers are able to take advantage of the well-known design and manufacturing methods for PCBs. For example, planar transformers have a predictable design method based on known and controlled material properties and geometrical tolerances in conventional PCB technology. Planar transformers may also have a shorter manufacturing time, lower fabrication cost, and lower assembly cost than traditional transformers. However, previous designs for planar transformers have not always been capable of reliable operation in medium to high voltage power converters. For example, previous attempts at high voltage isolation within planar transformers do not have sufficient margin to avoid undesired partial discharge. Accordingly, it would be desirable to manufacture a planar transformer using PCB technology for use in medium to high voltage power converters.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a device includes a printed circuit board (PCB), a high voltage coil disposed on the PCB, and a low voltage coil disposed on the PCB. The device also includes a conductive shield that forms a three-dimensional enclosure around the high voltage coil. The conductive shield confines an electric field generated by the device to the PCB.

In a second embodiment, a system includes a first printed circuit board (PCB) that includes circuitry and a second PCB that includes a planar transformer coupled to the circuitry and interacts with the first PCB. The planar transformer includes a magnetic core coupled to the second PCB, a high voltage coil disposed on the second PCB adjacent to the magnetic core, and a low voltage coil disposed on the second PCB adjacent to the magnetic core. The planar transformer also includes a conductive shield forming a three-dimensional enclosure around the high voltage coil. The conductive shield confines an electric field generated by the planar transformer to the second PCB.

In a third embodiment, a method for manufacturing a device includes disposing a high voltage coil and a low voltage coil on a printed circuit board (PCB). The method further includes disposing a conductive shield on the PCB. The conductive shield forms a three-dimensional enclosure around the high voltage coil and confines an electric field generated by the device within the PCB.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present subject matter will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. As used herein, the term "disposed over" or "deposited over" refers to disposed or deposited directly on top of and in contact with, or disposed or deposited on top but with intervening layers between.

Present embodiments relate to systems and methods for power conversion in medium to high voltage power systems. Specifically, the present embodiments relate to a planar power transformer that may operate at a capacity between approximately 1000 V and approximately 3000 V. The planar transformer may include a three-dimensional conductive shield to confine the electric field generated during operation. The three-dimensional conductive shield may be designed such that the planar transformer may still be manufactured using conventional printed circuit board (PCB) manufacturing technologies. The planar transformer may also include a specific positioning of the high voltage coil to reduce the amount of partial surface discharge present in a planar transformer of a given size and thickness. The planar transformer may also be manufactured as a stand-alone component that may be disposed on another PCB.

Figure 1:
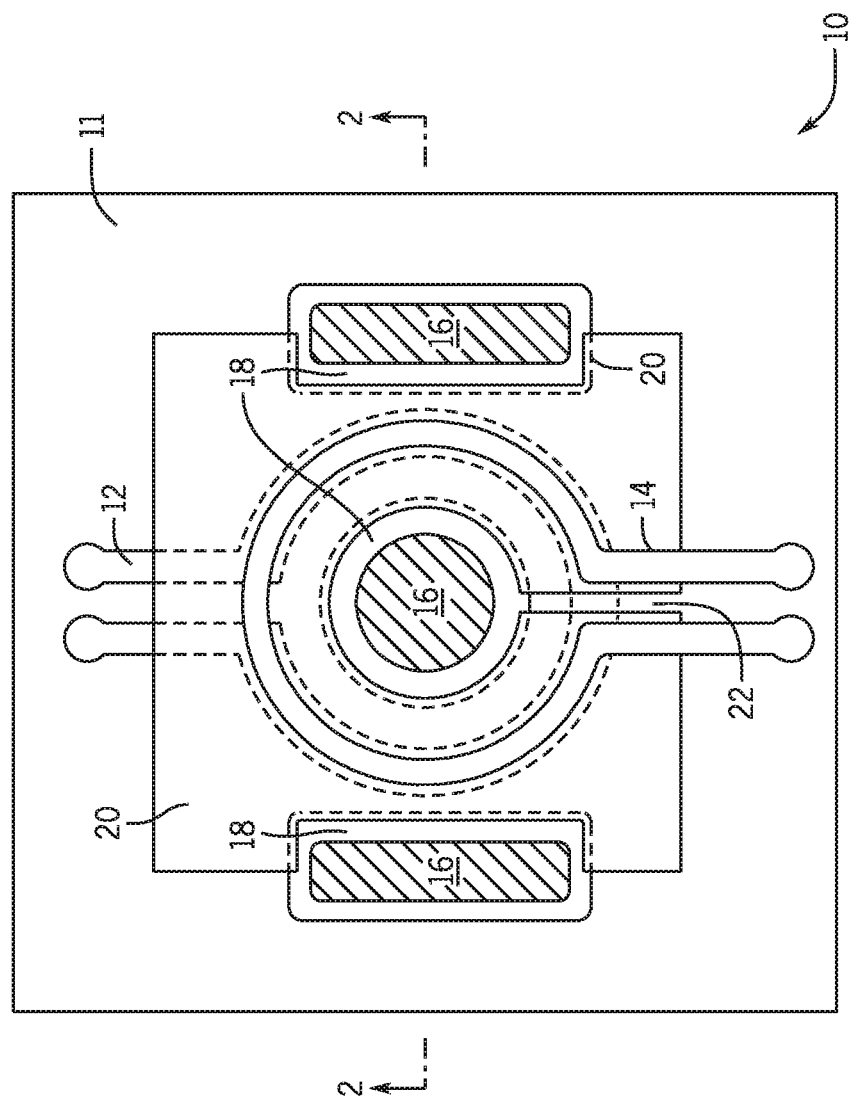
FIG. 1 is a top view of a planar transformer with a conductive shield, in accordance with an embodiment of the present approach.

With the foregoing in mind, FIG. 1 illustrates a top view of a planar power transformer 10. The planar transformer 10 may be manufactured on a PCB 11 and may include a high voltage coil 12, a low voltage coil 14, and a magnetic core 16. The PCB 11 itself may be made from an insulative material such as FR-4. The magnetic core 16 may be inserted into an aperture formed in the center of the PCB 11 during manufacturing. Alternatively, the magnetic core 16 may be a board-mounted component coupled to the planar transformer 10. The high voltage coil 12 and the low voltage coil 14 may be copper traces deposited on one or more of the PCB layers adjacent to the magnetic core 16. For example, FIG. 1 depicts the high voltage coil 12 and the low voltage coil 14 as traces in a spiral pattern around the magnetic core 16. In certain embodiments, the magnetic core 16 may be divided into three sections, one of which is coupled to the center of the PCB 11 and the other two adjacent to the high and low voltage coils, as shown in FIG. 1. There may also be air gaps 18 separating the magnetic core 16 from the other components of the planar transformer 10.

Although the planar transformer 10 illustrated in FIG. 1 is a power transformer, it should be appreciated that the planar transformer 10 may be one of many types of planar transformers (e.g., distribution transformers, poly-phase transformers, resonant transformers, audio transformers). Further, one or more of the embodiments described herein may focus on the relative positioning of the high voltage coil 12 to other components of the planar transformer 10. As such, the planar transformer 10 may be a step-up or step-down transformer depending on how it is electrically connected within a circuit. It should also be appreciated that while the embodiments herein described a multi-layered PCB, the PCB 11 may be a single-layer board in other embodiments.

During operation, one of the coils (e.g., coil 12) may be designated as the primary winding, and the other coil (e.g., coil 14) may be designated as the secondary winding. A varying current may be applied to the primary winding, which induces varying magnetic and electric fields in the magnetic core 16. The presence of the varying magnetic field induces a varying voltage within the secondary winding.

The electric field generated during operation may terminate on the magnetic core 16. As a result, there may be both tangential and normal electric field components at the air-solid interface, which may cause partial discharge across the board-core air gap or tangential to the board surface. Partial discharge may also occur within the PCB insulative material 11 (e.g., across microvoids), in the air surrounding the board 11 (e.g., across the air gap between the magnetic core 16 and the board 11, corona around electrodes), and along air-solid interfaces.

The partial discharge inception voltage (PDIV) and the partial discharge extinction voltage (PDEV) represent the voltage levels needed for partial discharge to occur within or on the surface of the planar transformer 10. To reduce the likelihood of partial discharge and improve the reliability and lifetime of the planar transformer, it may be desirable to increase the PDIV and/or the PDEV of the planar transformer 10. Further, the PDIV inside the insulative material 11 of the planar transformer 10 may be significantly higher than the PDEV in the air or along air-solid interfaces. As such, it may also be desirable to confine the electric field within the solid insulation of the PCB 11.

The planar transformer 10 may include a conductive shield 20 as illustrated in FIG. 1, which confines the electric field within the PCB dielectric material 11 and excludes the electric field from the volume beyond the dielectric. By confining the electric field within the insulative material 11, the conductive shield 20 may prevent the electric field from terminating near or on structures that reduce PDIV and PDEV levels (e.g., air, board-mounted components). The shield 20 may contain a slit 22 to prevent shorting during operation.

Figure 2:
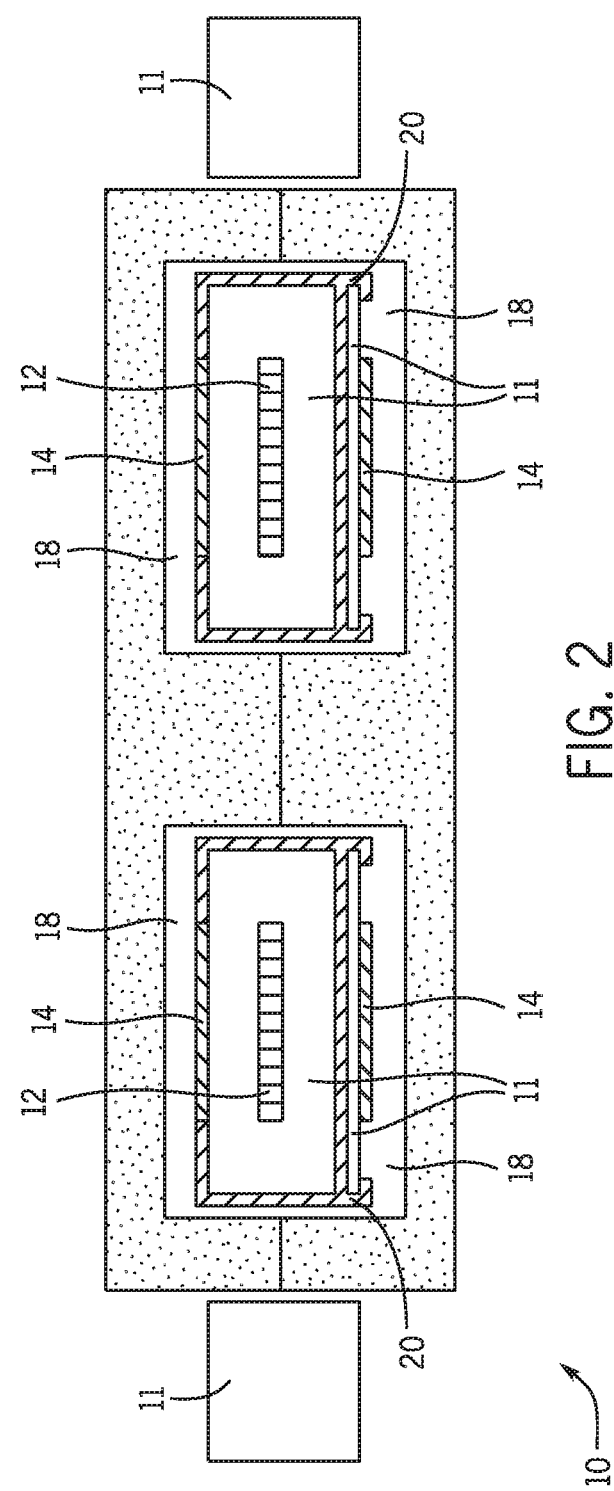
FIG. 2 is a cross-section of the planar transformer of FIG. 1, in accordance with an embodiment of the present approach.

FIG. 2 illustrates a cross section of the planar transformer 10 of FIG. 1 taken across the line 2-2. The conductive shield 20 may form a three-dimensional enclosure around the high voltage coil 12. In some embodiments, the conductive shield 20 may be copper traces deposited in the PCB layers above and below the high voltage coil. The traces for the conductive shield 20 may also be deposited adjacent to the coil 12 in each layer the coil 12 is present, forming a three-dimensional enclosure around the high voltage coil 12, as shown in FIG. 2. Air gaps 18 may be present between the magnetic core 16 and the conductive shield 20.

Additionally, the high voltage coil 12 may be located in, for example, an internal (non-exposed) layer of the PCB 11 to produce the highest possible PDIV and PDEV levels for a given board thickness. Further, the insulative material 11 within the shield may be concentrated around the high voltage coil 12. The traces for the low voltage coil 14 may then be deposited on the layers above and/or below the high voltage coil 12, near the uppermost and/or bottommost surfaces of the PCB (e.g., near the exposed upper and lower surfaces of the PCB). The low voltage coil 14 may be at the same potential as the conductive shield 20, and may act as the shield on a surface of the PCB, as shown in FIG. 2. If the low voltage coil 14 acts as part of the shield, but does not cover the entire shield window on the surface, then the area not filled by the low voltage coil 14 may be filled with the conductive shield 20.

Figure 4:
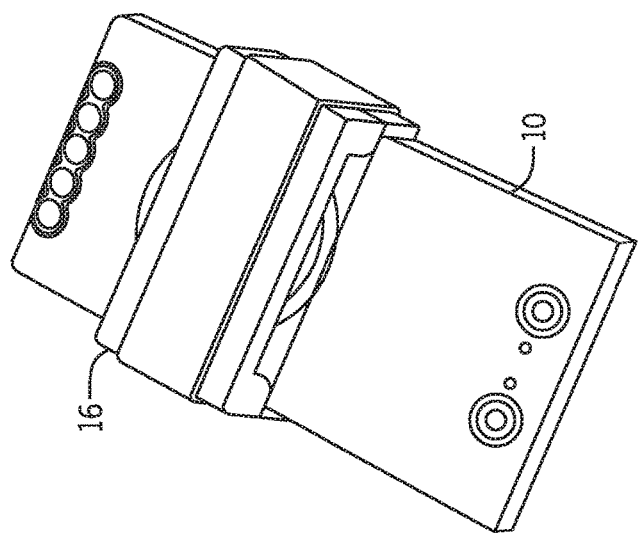
FIG. 4 is a top view of an assembled planar transformer, in accordance with an embodiment of the present approach.
Figure 3:
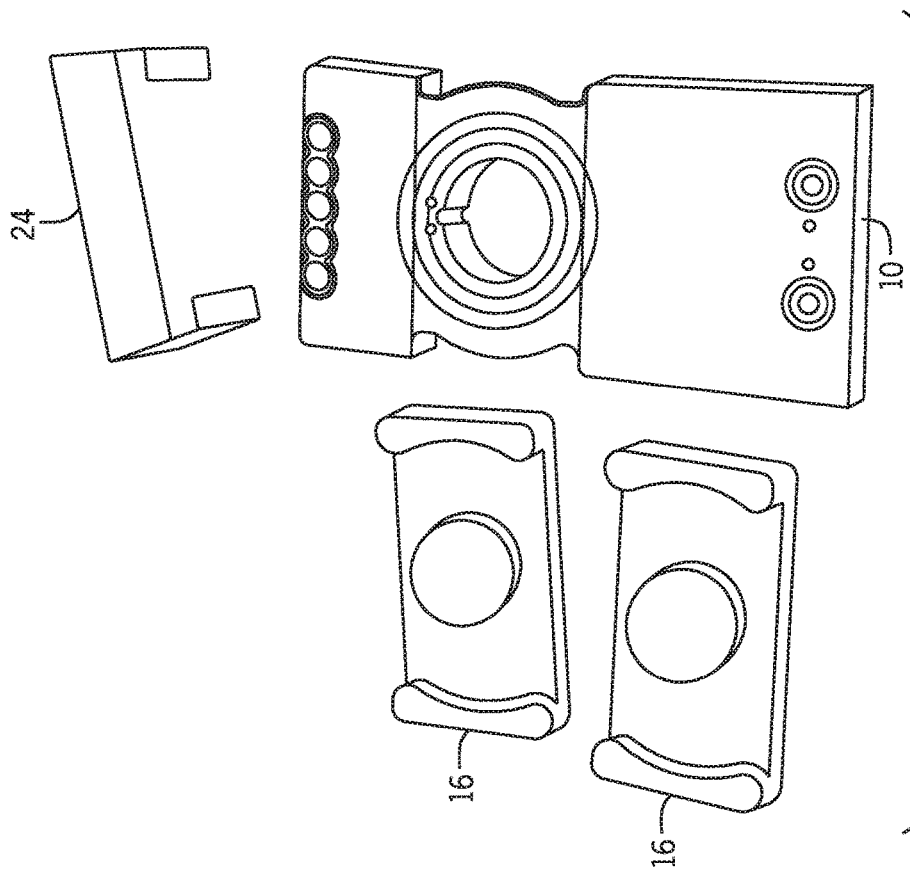
FIG. 3 is a top view of a planar transformer and magnetic core assembly in accordance with an embodiment of the present approach.
Figure 5:
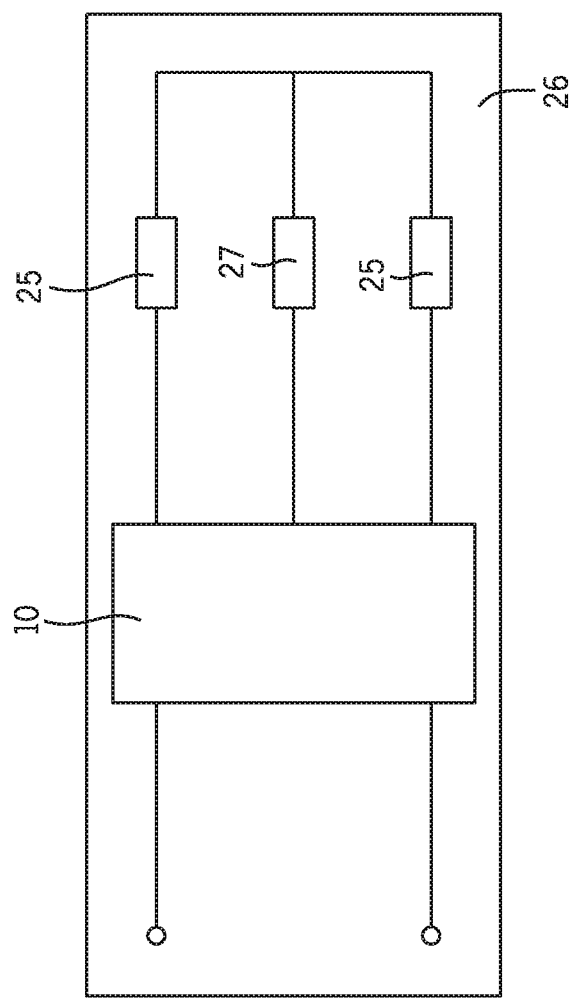
FIG. 5 is a schematic of a printed circuit board containing the planar transformer of FIG. 4, in accordance with an embodiment of the present approach.

The planar transformer 10 may be manufactured as a standalone device, as shown in FIGS. 3 and 4. The magnetic core 16 may be provided as top and bottom portions that may be inserted into the aperture formed in the PCB 11 and secured together with a fastener 24 (e.g., clips, clamps, straps, etc.). Alternatively, the magnetic core 16 may be a one-piece structure inserted into the aperture or coupled to the PCB 11, as described above. In some embodiments, a standalone planar transformer 10 may be a board-mounted component for a system PCB 26. For example, FIG. 5 illustrates a planar transformer 10 as a component of an AC-DC converter system PCB 26, which also includes two diodes 25 and a resistor 27. Alternatively, the planar transformer 10 may be integral with the system PCB 26.

Figure 6:
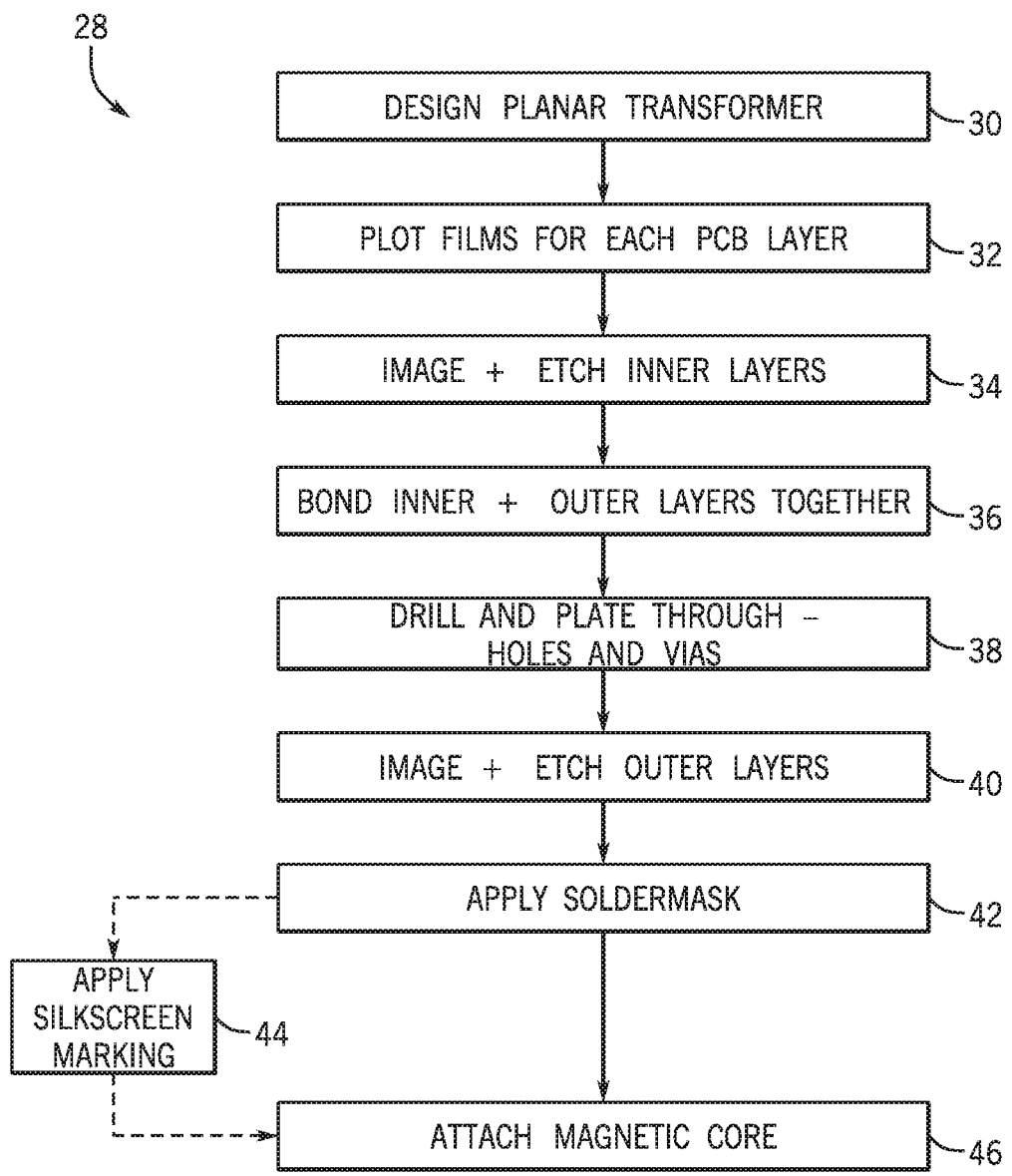
FIG. 6 is a block diagram illustrating a method of manufacturing a planar transformer having a conductive shield, in accordance with an embodiment of the present approach.

Because the conductive shield 20 may include copper traces, a planar transformer 10 with a conductive shield may be manufactured using conventional PCB manufacturing technologies. FIG. 6 illustrates a manufacturing method 28 for a standalone planar transformer with a conductive shield 20. In step 30, the planar transformer 10 is designed by adding traces for the high and low voltage coils. The design may also include traces for the conductive shield 20 on the layers of the uppermost and bottommost surfaces (e.g., on the exposed upper and lower surfaces of the PCB) as well as adjacent to (e.g., to the left and right of) the windings of the high and low voltage coils 12 and 14, respectively. The designs for each layer of the PCB are plotted onto films in step 32, which are then used to image and etch the inner layers in step 34. The inner and outer layers are bonded together in step 36. In step 38, the through-holes and vias are drilled in the PCB and are then plated with copper; this step may include drilling a hole in the conductive shield 20 to form the slit 22. The outer layers are imaged and etched in step 40, and a soldermask is applied to the PCB in step 42. If the designer wishes, a silkscreen marking may be applied to the PCB in step 44; as shown in FIG. 6, step 44 is optional. Finally, the magnetic core 16 may be coupled to the planar transformer 10 in step 46.

Technical effects of the described embodiments include improving the reliability and lifetime of planar transformers with a capacity of at least approximately 1000 V. Certain embodiments reduce the likelihood of partial discharge within or around the planar transformer. For example, a conductive shield within a planar transformer confines the generated electric field to the PCB dielectric material. This may increase the voltage levels required for partial discharge to occur, subsequently reducing the likelihood of partial discharge. Additionally, the high voltage coil of the planar transformer may be located in the middle layers of the PCB; this may increase the voltage levels required for partial discharge to the highest possible amount for a PCB of a given size and thickness. Some embodiments may enable the planar transformer to continue to be made using conventional PCB manufacturing technologies. For example, a conductive shield within the planar transformer may be copper traces, which are already present in PCBs and do not present a manufacturing challenge.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A device comprising:
a printed circuit board (PCB);
a high voltage coil comprising first traces disposed on at least one layer of the PCB; and
a low voltage coil comprising second traces disposed on at least one second layer of the PCB; and
a shield comprising a first portion directly coupled to a second portion, wherein the first portion of the shield is directly coupled to a portion of the low voltage coil as the second portion of the shield, wherein the conductive shield is configured to confine an electric field to the PCB.

2. The device of claim 1, wherein the conductive shield comprises at least one third trace coupled to the portion of the low voltage coil.

3. The device of claim 2, comprising at least one fourth trace coupled to the portion of the low voltage coil.

4. The device of claim 3, comprising at least one fifth trace coupled to the at least one third trace and the at least one fourth trace.

5. The device of claim 4, wherein the portion of the low voltage coil, the at least one third trace, the at least one fourth trace, and the at least one fifth trace comprise a three-dimensional enclosure around the high voltage coil.

6. The device of claim 1, wherein the PCB comprises an aperture surrounded by each of the high voltage coil and the low voltage coil.

7. The device of claim 6, comprising a magnetic core disposed in the aperture.

8. The device of claim 6, comprising a magnetic core comprising a first section disposed in the aperture, a second section disposed adjacent to the high voltage coil, and a third section disposed adjacent to the low voltage coil.

9. The device of claim 1, wherein the first layer and the second layer are disposed at different heights with respect to a bottom portion of the PCB.

10. The device of claim 1, wherein the shield comprises a top layer disposed on a first exposed layer of the PCB and a bottom layer disposed on a second exposed layer of the PCB.

11. The device of claim 10, wherein at least one of the top or bottom layer comprises one or more windings of the low voltage coil.

12. A system comprising:
a first printed circuit board (PCB) comprising circuitry; and
a second PCB comprising a planar transformer, wherein the second PCB is configured to be coupled to the first PCB, wherein the planar transformer comprises:
a magnetic core coupled to the second PCB;
a high voltage coil comprising first traces disposed on a first layer of the second PCB and adjacent to the magnetic core;
a low voltage coil comprising second traces disposed on a second layer of the second PCB and adjacent to the magnetic core; and
a shield comprising a first portion directly coupled to a second portion, wherein the first portion of the shield is directly coupled to a portion of the low voltage coil as the second portion of the shield, wherein the conductive shield is configured to confine an electric field to the PCB.

13. The system of claim 12, wherein the magnetic core is at least partially disposed within an aperture formed in the second PCB.

14. The system of claim 13, wherein the magnetic core comprises a top section and a bottom section, and wherein top and bottom sections are disposed within the aperture and are secured together with a fastener.

15. The system of claim 14, wherein the top section and the bottom section combine to comprise a second section of the magnetic core and a third section of the magnetic core.

16. The system of claim 12, wherein the second PCB is a board-mounted component disposed on the first PCB.

17. The system of claim 12, wherein the first PCB comprises a third trace configured to couple the planar transformer to the circuitry.

18. A method for manufacturing a device, comprising:
   disposing a high voltage coil comprising first traces on a first layer of a printed circuit board (PCB); and
   disposing a low voltage coil comprising second traces on a second layer of PCB, wherein a portion of low voltage coil comprises a first portion of a shield, wherein the portion of the low voltage coil is directly coupled to a second portion of the shield, wherein the shield is configured to confine an electric field to the PCB.

19. The method of claim 18, wherein the method further comprises coupling a magnetic core to the PCB.

20. The method of claim 18, wherein the method further comprises applying a silkscreen marking to the PCB.

* * * * *